United States Patent [19]
Mariyama

[11] Patent Number: 6,037,613
[45] Date of Patent: Mar. 14, 2000

[54] BIDIRECTIONAL THYRISTOR DEVICE

[75] Inventor: Mitsuru Mariyama, Kitakatsuraqi-gun, Japan

[73] Assignee: Sharp Kabushiki Kaisha, Osaka, Japan

[21] Appl. No.: 09/028,062

[22] Filed: Feb. 23, 1998

[30] Foreign Application Priority Data

Feb. 24, 1997 [JP] Japan ................................. 9-039407

[51] Int. Cl.[7] .............................................. H01L 29/74
[52] U.S. Cl. ...................... 257/119; 257/110; 257/120; 257/175
[58] Field of Search .................................. 257/119, 110, 257/175, 139, 140, 141, 120, 121

[56] References Cited

U.S. PATENT DOCUMENTS

| | | | |
|---|---|---|---|
| 4,244,000 | 1/1981 | Ueda et al. | 357/39 |
| 4,612,562 | 9/1986 | Motojima et al. | 357/38 |
| 4,779,126 | 10/1988 | Herman | 357/39 |
| 4,994,884 | 2/1991 | Kato et al. | 357/39 |
| 5,272,363 | 12/1993 | Pezzani | 257/173 |
| 5,747,836 | 5/1998 | Mariyama | 257/119 |

FOREIGN PATENT DOCUMENTS

| | | | |
|---|---|---|---|
| 356055070 | 5/1981 | Japan | 257/119 |
| 3-37746 B2 | 6/1991 | Japan | |
| 404111468 | 4/1992 | Japan | 257/119 |

OTHER PUBLICATIONS

Ohkoshi et al, Analysis of dv/dt Characteristics of Lateral PNPN Devices, SSD–78–14, pp. 7–16 w/partial English translation.

*Primary Examiner*—David Hardy
*Assistant Examiner*—Hay Bui
*Attorney, Agent, or Firm*—Nixon & Vanderhye P.C.

[57] ABSTRACT

In a bidirectional photothyristor formed on a single N type silicon substrate, a distance between a P-gate diffusion region of one thyristor and an anode diffusion region of another thyristor opposed thereto is set to be 40 to 1,000 $\mu$m, preferably, 70 to 600 $\mu$m, thereby eliminating a malfunction caused by a noise due to a differentiation circuit which is composed of parasitic resistors and junction capacitances. In a field portion between the P-gate diffusion region and the anode diffusion region, an oxygen-doped semi-insulating film is formed via an $SiO_2$ film, and an Al conductor is removed to form a field light receiving portion. Unlike a P-gate light receiving portion formed in the P-gate diffusion region, the field light receiving portion does not involve a junction capacitance. Therefore, a light sensitivity can be enhanced without lowering a dV/dt resistance.

20 Claims, 11 Drawing Sheets

BIDIRECTIONAL THYRISTOR DEVICE

BACKGROUND OF THE INVENTION

1. Field of the Invention

The present invention relates to a bidirectional thyristor device which can be used in a commercial AC power source line or the like, and particularly to a structure of a chip of a bidirectional photothyristor to which a trigger signal can be given in response to light irradiation.

2. Description of the Related Art

Conventionally, a bidirectional photothyristor 2 which, as shown in FIGS. 9 to 11, is formed on a single semiconductor chip such as an N type silicon substrate 1 and which is optically controlled by giving a gate trigger signal in response to light irradiation is widely used as a so-called solid state relay (hereinafter, often abbreviated as "SSR"). FIG. 9 is a schematic plan section view, FIG. 10 is a section view taken along a section line X—X of FIG. 9, and FIG. 11 is a diagram of an equivalent circuit of the bidirectional photothyristor 2. FIG. 9 corresponds to a section view taken along a section line IX—IX of FIG. 10.

Usually, the N type silicon substrate 1 has an impurity concentration of $10^{13}$ to $10^{15}$ cm$^{-3}$. A channel stopper region 6 is disposed around a portion where the bidirectional photothyristor 2 is formed. An N type diffusion layer 7 is disposed on a back of the N type silicon substrate 1. The channel stopper region 6 and the N type diffusion layer 7 are formed by diffusing N type impurities in a higher concentration than that of the N type silicon substrate 1. An Al conductor 8 is formed on a surface of the N type silicon substrate 1 in order to attain electrical connections. A $SiO_2$ (silicon oxide) film 9 is formed in a portion where electrical insulation is required. An oxygen-doped semi-insulating film 10 is formed on the $SiO_2$ film.

In the bidirectional photothyristor 2, P-gate light receiving portions 11 and 21 are formed in order to receive a light signal. In each of the portions, the Al conductor 8 is removed so as to form an opening. P type anode diffusion regions 12 and 22, and P type P-gate diffusion regions 13 and 23 which are opposed to the anode diffusion regions 12 and 22 are disposed on the surface of the N type silicon substrate 1. The P-gate light receiving portions 11 and 21 are disposed on the P-gate diffusion regions 13 and 23, respectively. N type cathode diffusion regions 14 and 24 are formed in the P-gate diffusion regions 13 and 23, respectively. Gate resistance regions 15 and 25 are formed between the P-gate diffusion regions 13 and 23, and anode diffusion regions 22 and 12 which are disposed at a distance L from the P-gate diffusion regions 13 and 23, respectively. In this way, the P type anode diffusion regions 12 and 22, the N type silicon substrate 1, the P type P-gate diffusion regions 13 and 23, and the N type cathode diffusion regions 14 and 24 form PNPN type lateral reverse blocking thyristors 16 and 26 having the gate resistance regions 15 and 25, respectively. In the bidirectional photothyristor 2, the reverse blocking thyristors 16 and 26 are connected to each other in a reverse direction so as to be formed as channels ch1 and ch2, respectively. When a surface of the bidirectional photothyristor 2 is directly irradiated with light, the thyristor functions as a fundamental optically controlled bidirectional thyristor. When an AC power source is to be controlled, the thyristor may be provided with a zero-cross function in which a trigger is enabled only in a restricted voltage range in a vicinity of a zero-cross point of the AC power source.

As described above, the impurity concentration of the N type silicon substrate 1 is $10^{13}$ to $10^{15}$ cm$^{-3}$. The P type diffusion regions, such as the anode diffusion regions 12 and 22 and the P-gate diffusion regions 13 and 23, use boron (B) or the like as impurities and their impurity concentrations are $10^{15}$ to $10^{19}$ cm$^{-3}$. The N type diffusion regions, such as the cathode diffusion regions 14 and 24, use phosphorus (P) or the like as impurities and their impurity concentrations are set to be $10^{19}$ cm$^{-3}$ or higher. The distance L between the anode diffusion regions 12, 22 and the P-gate diffusion regions 13, 23 is about 15 to 30 μm.

The anode diffusion region 12 of the one thyristor 16, and the cathode diffusion region 24 of the other photothyristor 26 are electrically led out to the surface of the N type silicon substrate 1 via the Al conductor 8 and then connected as an electrode T1 in parallel by wires to a frame terminal which is disposed on a package housing the bidirectional photothyristor 2. Similarly, the cathode diffusion region 14 of the one thyristor 16, and the cathode diffusion region 24 of the other photothyristor 26 are electrically connected by wires to an electrode T2. The $SiO_2$ film 9 and the oxygen-doped semi-insulating film 10 are used as passivation films.

As shown in FIG. 11, in the thyristors 16 and 26, PNP transistors 17 and 27, and NPN transistors 18 and 28 are equivalently formed. Junction capacitances Co are parasitically formed between the bases and the collectors of the PNP transistors 17, 27 and the NPN transistors 18, 28.

The thus configured lateral bidirectional photothyristor 2 is requested to enhance the light sensitivity, and also to improve noise immunity so that ignition does not occur erroneously by a noise. For example, Japanese Examined Patent Publication JP-B2 3-37746 (1991) discloses a technique which can prevent a malfunction due to a sharp noise and improve the light sensitivity, without using complex production steps.

In the prior art technique, in order to design a thyristor so as to give more advantages to both the chip sensitivity and the noise resistance which are in a tradeoff relationship, $h_{FE}$ of each lateral PNP transistor is increased so as to improve the light sensitivity, and the gate resistance is lowered so as to enhance the noise resistance. Moreover, a phosphorus diffusion layer is formed on a back of a semiconductor substrate so that $h_{FE}$ of each PNP transistor is further increased.

Regarding the noise resistance of a thyristor, a thesis entitled "Analysis on the dV/dt characteristics of a lateral PNPN device" is printed in SSD 78-14, pp. 7 to 16. According to the thesis, the dV/dt characteristics of a thyristor device have been analyzed by using an enhanced Ebers-Moll model, and it has been successful to grasp the dependency of the dV/dt characteristics on the device constants. It has been found that parameters which largely affect the dV/dt characteristics are a gate-cathode resistance $R_{Gk}$, a base width of PNP transistor, and a gate junction area. Also it has been found that $h_{FE}$ of the NPN transistor and the cathode area exert relatively small effects.

As shown in FIG. 11, a line of a commercial AC power source (hereinafter, often abbreviated as "AC") is connected to external frame terminals T1 and T2 of the bidirectional photothyristor 2. In this case, when a pulse-like noise voltage whose peak value reaches about 2,000 V on a steep rising edge of a pulse is superimposed on the AC line, there occurs a malfunction where erroneous ignition is caused even in the absence of light irradiation. It is considered that this is caused by the following reason. First, a displacement current $i_D$ indicated by a first expression below flows through the junction capacitances Co shown in FIG. 11 and enters the P-gate diffusion regions 13 and 23 to function as a trigger current, thereby causing the malfunction. Hereinafter, such a mode is referred to as a dV/dt mode.

$$i_D = \frac{dQ}{dt} = \frac{d(CoV)}{dt} = Co\frac{dV}{dt} + V\frac{dCo}{dt} \quad (1)$$

When it is assumed that Co is constant, the first expression is modified as the following second expression.

$$i_D = Co\frac{dV}{dt} \quad (2)$$

As a result, it will be seen that, as the value of dV/dt is larger, the displacement current $i_D$ is increased and erroneous ignition occurs more easily. In other words, from the second expression, the gate voltage $V_G$ of each of the thyristors 16 and 26 is indicated by the following third expression.

$$V_G = i_D R_{GK} \approx Co R_{GK} \frac{dV}{dt} \quad (3)$$

When a value of the gate voltage $V_G$ exceeds an active voltage $V_{GK}$ of the corresponding thyristor 16 or 26, erroneous ignition occurs.

In a second mode in which erroneous ignition is caused by a noise, a pulse-like noise voltage falls to be turned off, a characteristic voltage is then generated at the P gate with a delay of several tens of microseconds, and this voltage functions as to generate a trigger current, thereby causing a malfunction. This mode is referred to as a delay voltage mode.

FIGS. 12 to 14 show an assumed cause of a malfunction due to the delay voltage mode, and a related configuration. As shown in FIG. 12, a positive voltage is applied to the anode diffusion region 12 of the one thyristor 16 as an anode A, and the cathode diffusion region 14 is grounded as a cathode electrode K. As a result, the anode diffusion region 22 of the other photothyristor 26 is grounded so as to produce a reversely biased state. An electrical resistance of the N type silicon substrate 1 between the one anode diffusion region 12 and the P-gate diffusion region 13 is equivalently indicated as R1, and an equivalent resistance of the N type silicon substrate 1 between the one anode diffusion region 12 and the other anode diffusion region 22 is indicated as R2. The junction capacitances between the N type silicon substrate 1, and the P type anode diffusion region 12, the P-gate diffusion region 13, the anode diffusion region 22 are indicated by C1, C2, and C4, respectively. The junction capacitance between the P-gate diffusion region 13 and the cathode diffusion region 14 is indicated as C3. A gate resistance formed in the gate resistance region 15 is indicated as $R_{GK}$. As shown in FIG. 13, it will be seen that an equivalent differentiation circuit is parasitically formed. When an input voltage Vin on which a noise pulse with a peak value of 2,000 V (max) is superimposed is applied to an input side of the circuit, in an output voltage Vout appearing at the P gate $P_G$ which is formed in the P-gate diffusion region 13, differential outputs corresponding to rise and fall of the noise pulse, and a delay voltage in which certain time has elapsed after the fall are generated as shown in FIG. 14. An upper portion of FIG. 14 shows a change V1 (V) of the input voltage Vin of FIG. 13. When a noise with a pulse width of 1 μs and a peak value of 2,000 V is input between a time t=0 and a time t=1, in V2 (V) of the output voltage Vout, differential waveforms corresponding to the rise and the fall are output at time t=0 and time t=1, respectively, and a delay voltage is generated near and after a time t=15 as shown in a lower portion of FIG. 14.

In order to improve the noise resistance in the dV/dt mode, usually, methods such as that the junction capacitances Co of the P-gate diffusion regions 13 and 23 are reduced and the gate resistance $R_{GK}$ or the current amplification factors $h_{FE}$ of the NPN transistors 18 and 28 are suppressed are employed. However, the reduction of the junction capacitances Co of the P-gate diffusion regions 13 and 23 causes the light receiving regions of the P-gate light receiving portions 11 and 21 to be narrowed, and the reduction of the gate resistance $R_{GK}$ and the current amplification factors $h_{FE}$ of the NPN transistors causes the light sensitivity of the photothyristor to be lowered. In other words, there is so-called tradeoff relationship between the noise resistance and the light sensitivity, and improvement of one of them involves impairment of the other. The above-mentioned prior art technique of Japanese Examined Patent Publication JP-B2 3-37746 (1991) discloses a configuration for improving both the noise resistance and the light sensitivity.

Recently, an SSR is requested to reduce the power consumption or to be directly driven by a microcomputer. Furthermore, it is strongly requested to enhance the sensitivity. The most important problem is to attain both a high sensitivity in a range where a minimum input trigger current $I_{FT}$ is about 5 mA, and a high noise resistance conflicting therewith, and also to attain cost reduction including reduction in an area of a semiconductor chip. There is no literature or the like which points out or elucidates a phenomenon of the delay voltage mode which causes a malfunction due to a noise, and no effective countermeasure against the phenomenon is taken.

SUMMARY OF THE INVENTION

An object of the invention is to provide a bidirectional thyristor device in which a noise resistance including a delay mode can be improved, and light sensitivity can be enhanced by increasing an effective light receiving area without increasing a junction capacitance.

The invention provides a bidirectional thyristor device comprising a pair of planar type thyristors with a PNPN lateral structure, formed on a single semiconductor substrate, wherein intervals in a range from 40 μm to 1,000 μm are provided between a P-gate diffusion region of one thyristor and an anode diffusion region of the other thyristor and between an anode diffusion region of the one thyristor and a P-gate diffusion region of the other thyristor.

According to the invention, the intervals between the P-gate diffusion region of the one thyristor and the anode diffusion region of the other thyristor, and between the anode diffusion region of the one thyristor and the P-gate diffusion region of the other thyristor are 40 μm or longer. As compared with a thyristor with a conventional structure in which the interval is about 15 to 30 μm, therefore, effects due to resistances and junction capacitances which parasitically exist in the semiconductor substrate can be lowered and a malfunction due to a pulse noise can be eliminated. The interval is 1,000 μm at the maximum. When a hook-like configuration in which a P-gate diffusion region of the other thyristor is formed between the P-gate diffusion region of one of the thyristors and the anode diffusion region of the other of the thyristors is formed in a surface of the bidirectional thyristor device, therefore, the noise resistance can be improved without increasing the whole area of a semiconductor chip.

According to the invention, the interval between the P-gate diffusion region of one of the pair of thyristors which are provided on the single semiconductor substrate so as to have a PNPN lateral structure, and the anode diffusion region of the other thyristor can be made larger than that of the conventional bidirectional thyristor. Therefore, the noise resistance can be improved.

The invention is characterized in that the interval is in a range of 70 µm to 600 µm.

According to the invention, the intervals between the P-gate and anode diffusion regions of the one thyristor and the anode and P-gate diffusion regions of the other thyristor, respectively, are 70 µm or longer. Therefore, the thyristor device can be used in a range where the noise resistance is 2,000 V or more. Since the intervals are not longer than 600 µm, also a size of a semiconductor chip can be reduced.

According to the invention, the intervals between the P-gate and anode diffusion regions of the one thyristor and the anode and P-gate diffusion regions of the other thyristor, respectively, are set between 70 µm and 600 µm. Therefore, the noise resistance can be improved and the area of a semiconductor chip can be prevented from being increased.

The invention is characterized in that a light receiving portion is formed in the P-gate diffusion region of each of the thyristors so that the thyristor device has an optical triggering function.

According to the invention, since an optical triggering function is provided, the thyristor device functions as a bidirectional photothyristor and the resistance against a pulse noise can be enhanced without lowering the light sensitivity.

According to the invention, in the bidirectional thyristor having an optical triggering function, the noise resistance can be improved without lowering the light sensitivity.

The invention is characterized in that light receiving regions for an optical trigger are formed on fields between the P-gate diffusion region of the one thyristor and the anode diffusion region of the other thyristor and between the anode diffusion region of the one thyristor and the P-gate diffusion region of the other thyristor.

According to the invention, the intervals are increased and the light receiving regions for an optical trigger are formed on the fields between the P-gate and anode diffusion regions of the one thyristor and the anode and P-gate diffusion regions of the other thyristor, respectively. Therefore, the junction capacitance is not increased, and the light sensitivity can be improved without lowering the noise resistance.

According to the invention, the intervals between the P-gate diffusion region of the one thyristor and the anode diffusion region of the other thyristor and between the anode diffusion region of the one thyristor and the P-gate diffusion region of the other thyristor are increased so as to improve the noise resistance, and also the light sensitivity can be improved by forming the light receiving regions with using the intervals.

The invention is characterized in that the semiconductor substrate is a silicon substrate, and a polysilicon film is formed on a surface of the light receiving region via a silicon oxide film.

According to the invention, a polysilicon film is formed on the field between the P-gate diffusion region of the one thyristor and the anode diffusion region of the other thyristor, via a silicon oxide film. A polysilicon film is electrically conductive. Therefore, the film is connected to, for example, the cathode side, and a vicinity of the front of an N type silicon substrate is inverted to the P type, whereby a depletion layer is allowed to be easily extended so as to prevent dielectric strength from being lowered. Furthermore, carriers generated when light is received are collected into the depletion layer on the surface so that a photocurrent generated by light irradiation is increased, whereby the light sensitivity can be improved without increasing the junction capacitance.

According to the invention, the light receiving region is formed by using a passivation film formed on the silicon substrate, and the polysilicon film is connected to the cathode side so that the conductivity type of the surface of the silicon substrate is inverted. As a result, a depletion layer is extended and the light sensitivity can be improved.

The invention is characterized in that the semiconductor substrate is a silicon substrate, and an oxygen-doped semi-insulating film is formed on a surface of the light receiving region via a silicon oxide film.

According to the invention, an oxygen-doped semi-insulating film is formed on the field between the P-gate diffusion region of the one thyristor and the anode diffusion region of the other thyristor, via a silicon oxide film. An oxygen-doped semi-insulating film is electrically conductive. For example, therefore, the film is connected to the cathode side, and the vicinity of the front of an N type silicon substrate is inverted to the P type, whereby a depletion layer is allowed to be easily extended so as to prevent the dielectric strength from being lowered. Furthermore, carriers generated when light is received are collected into the depletion layer so that a photocurrent generated by light irradiation is increased, whereby the light sensitivity can be improved without increasing the junction capacitance.

According to the invention, an oxygen-doped semi-insulating film is formed on the silicon substrate via a silicon oxide film, whereby the light sensitivity can be improved.

The invention is characterized in that the thyristor device is provided with a zero-cross function.

According to the invention, since the bidirectional thyristor device is provided with a zero-cross function, a switching operation is conducted only in a vicinity of a zero-cross point of a voltage change of an AC power source, and it is possible to prevent generation of a noise in the case where a switching control is conducted in a high-voltage state.

The invention is characterized in that, in the pair of thyristors, channels are formed in a direction parallel to the surface of the semiconductor substrate, the P-gate diffusion region, the anode diffusion region, and the cathode diffusion area of each of the thyristors are formed to be perpendicular to a direction of the channel, and gate resistance regions are formed between the P-gate diffusion region of the one thyristor and the anode diffusion region of the other thyristor and between the anode diffusion region of the one thyristor and the P-gate diffusion region of the other thyristor, on one end side of a direction perpendicular to the direction of the channel.

The invention is characterized in that the P-gate diffusion region of the one thyristor is formed between the P-gate diffusion region of the other thyristor and the anode diffusion region of the one thyristor and the P-gate diffusion region of the other thyristor is formed between the P-gate diffusion region of the one thyristor and the anode diffusion region of the other thyristor.

According to the invention, a bidirectional thyristor having a zero-cross function is formed on one semiconductor substrate and noise generation due to switching control can be reduced.

An object of the invention is to advantageously design the chip sensitivity and the noise resistance which is a tradeoff with respect to the chip sensitivity, in the same manner as the prior art of Japanese Examined Patent Publication JP-B2 3-37746 (1996). In order to attain the object, the distance L between the gate diffusion region of the one thyristor and the anode diffusion region of the other thyristor is set within a fixed range (40 to 1,000 μm), thereby lowering a delay voltage which is generated by a differentiation circuit composed of a parasitic resistor and a junction capacitance and which causes a malfunction. The invention is different in this point from the prior art.

Furthermore, a field light receiving portion is provided by using a region of the distance L between the gate diffusion region of the one thyristor and the anode diffusion region of the other thyristor, and the gate diffusion region is made smaller, whereby a junction capacitance which is one of the causes of a malfunction is reduced.

In the field light receiving portion, an oxygen-doped semi-insulating film is formed via an $SiO_2$ film. In a reversely biased condition, the vicinity of the surface of a silicon substrate is inverted to the P type, whereby a depletion layer is allowed to be easily extended so as to prevent the dielectric strength from being lowered. Furthermore, carriers generated when light is received are collected into the depletion layer of the surface so that a photocurrent generated by light irradiation is increased, whereby the sensitivity is made higher.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
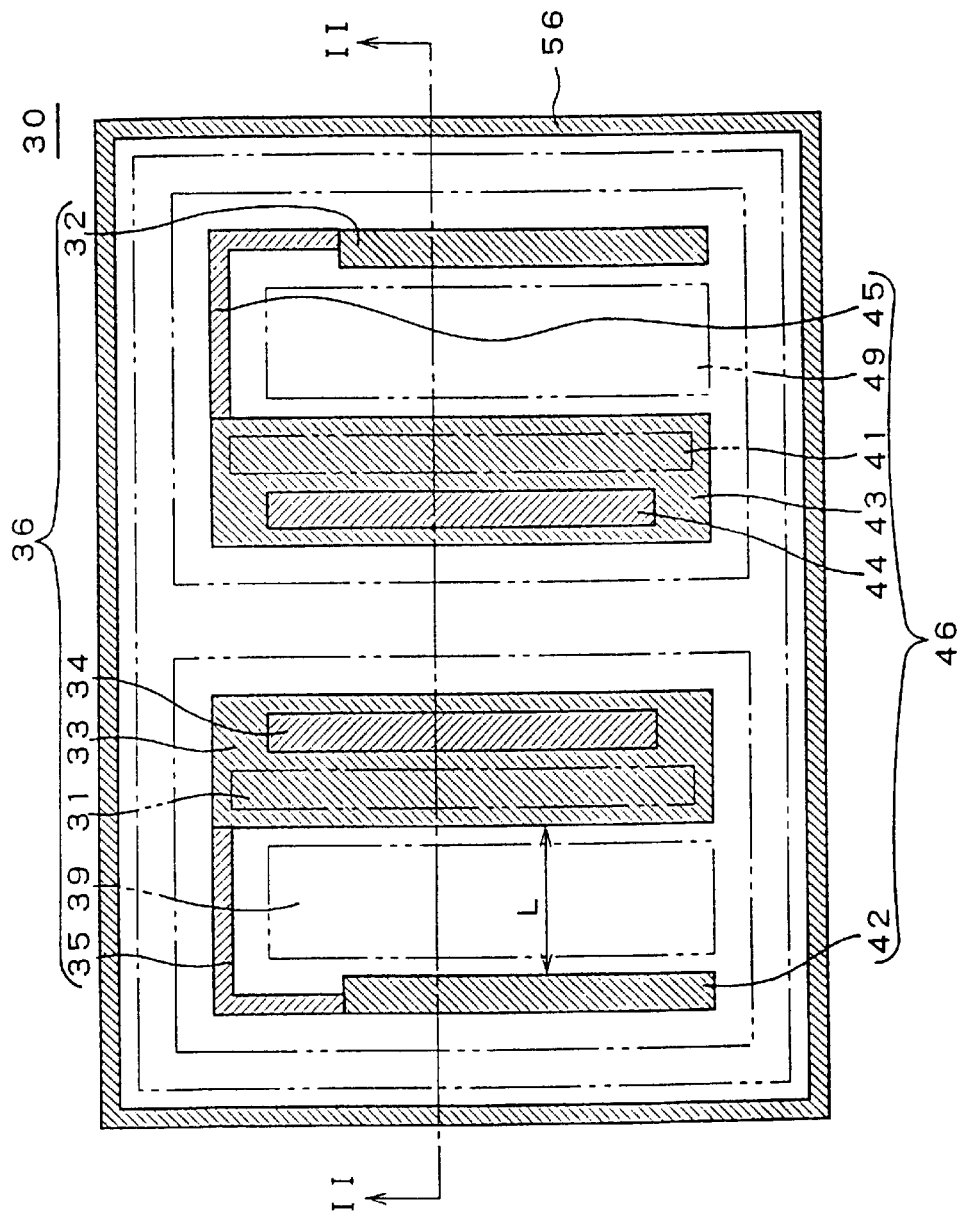
FIG. 1 is a plan section view of a bidirectional photothyristor 30 of an embodiment of the invention.

Now referring to the drawings, preferred embodiments of the invention are described below.

Figure 2:
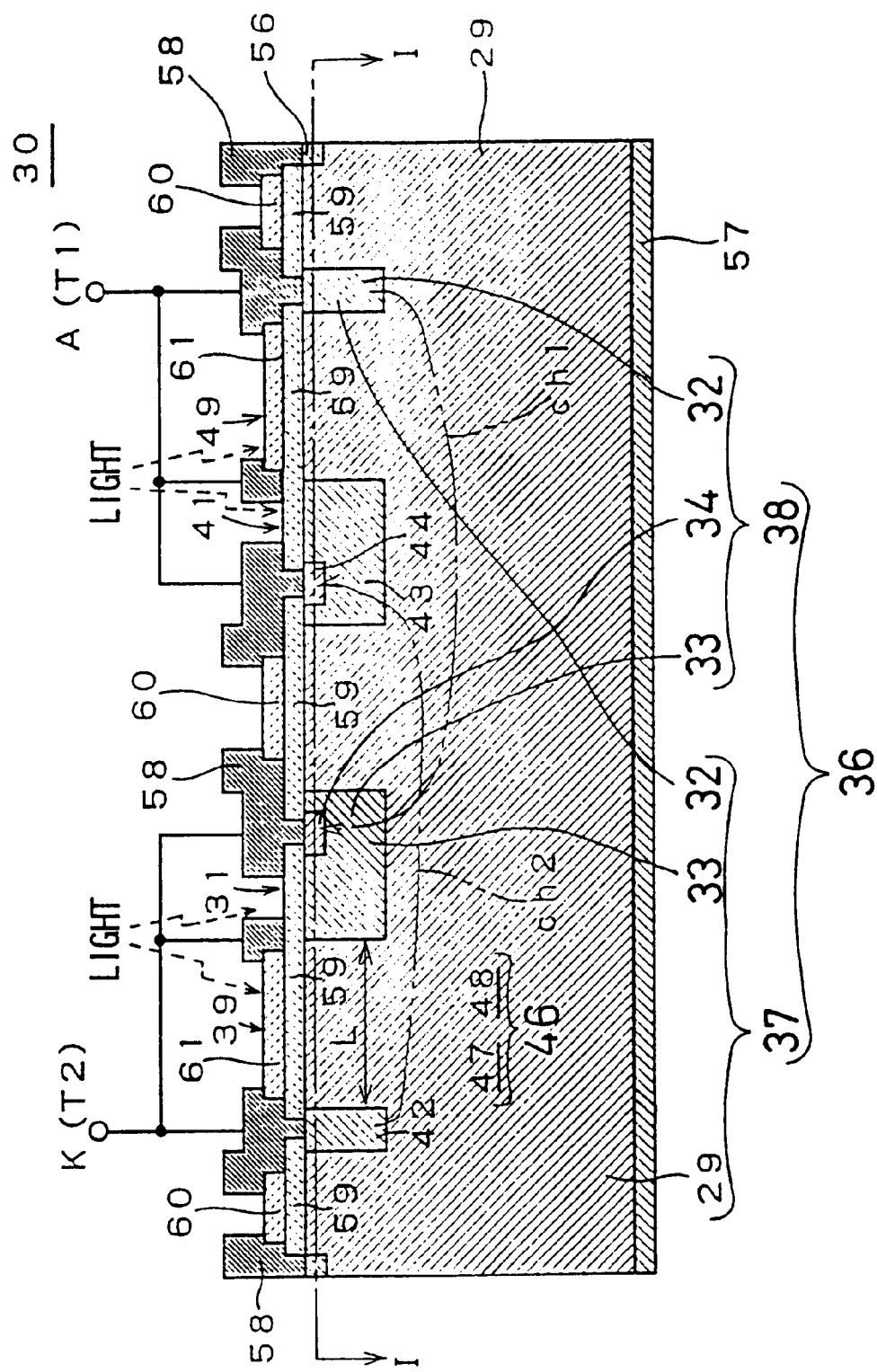
FIG. 2 is a section view taken along a section line II—II of FIG. 1.

FIGS. 1 and 2 show a basic structure of a semiconductor integrated circuit chip of a bidirectional photothyristor 30 which is formed on an N type silicon substrate 29 as an embodiment of the invention. Even when a substrate of another semiconductor material is used, the invention may be applied in a similar manner. FIG. 1 is a plan section view, and FIG. 2 is a section view taken along a section line II—II of FIG. 1. FIG. 1 corresponds to a section view taken along a section line I—I of FIG. 2. P-gate light receiving portions 31 and 41 are configured by anode diffusion regions 32 and 42, an N type silicon substrate 29, P-gate diffusion regions 33 and 43, and cathode diffusion regions 34 and 44. The P-gate light receiving portions are respectively disposed in thyristors 36 and 46 having a basic structure of a PNPN in which resistors due to gate resistance diffusion regions 35 and 45 are connected between the gate and the cathode as described later. The thyristors 36 and 46 have a lateral structure and electrically function as reverse blocking type ones. The pair of thyristors 36 and 46 are connected to each other in reverse parallel to constitute the bidirectional photothyristor 30 having channels ch1 and ch2 which can be controlled by light irradiation onto the P-gate light receiving portions 31 and 41. It may be considered that each of the thyristors 36 and 46 is configured by: a PNP transistor 37 consisting of the anode diffusion regions 32 and 42, the N type silicon substrate 29, and the P-gate diffusion regions 33 and 43; and NPN transistors 38 and 48 consisting of the N type silicon substrate 29, the P-gate diffusion regions 33 and 43, and the cathode diffusion regions 34 and 44.

The distance L between the P-gate diffusion region 33 of the one thyristor 36 and the anode diffusion region 42 of the other thyristor 46 is elongated to 150 μm. In a structure of the prior art, usually, the distance L is 15 to 30 μm. Field light receiving portions 39 and 49 are formed in portions surrounded by the P-gate diffusion region 33 and the gate resistance diffusion region 35 of the one thyristor 36 and the anode diffusion region 42 of the other thyristor 46, respectively.

Figure 9:
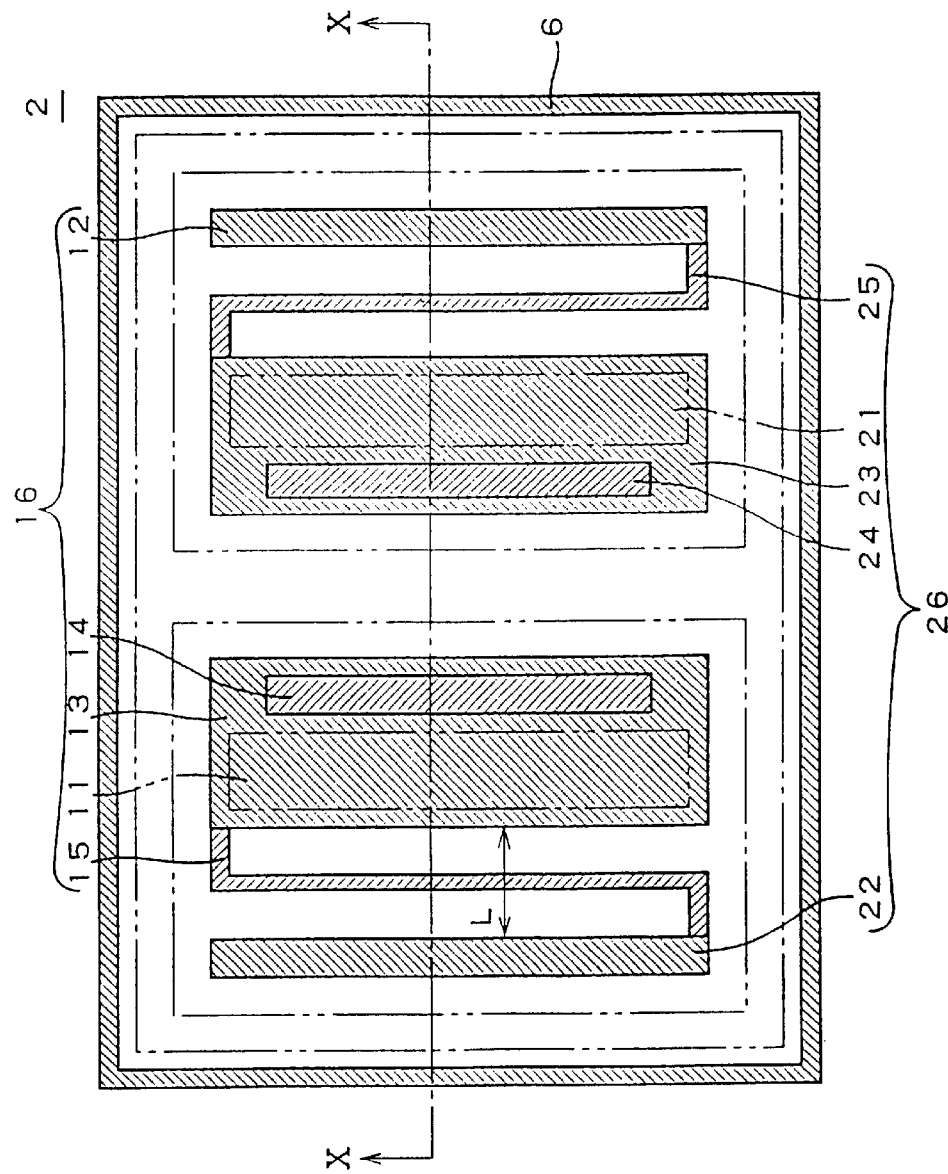
FIG. 9 is a plan section view of a bidirectional photothyristor 2 of the prior art.
Figure 10:
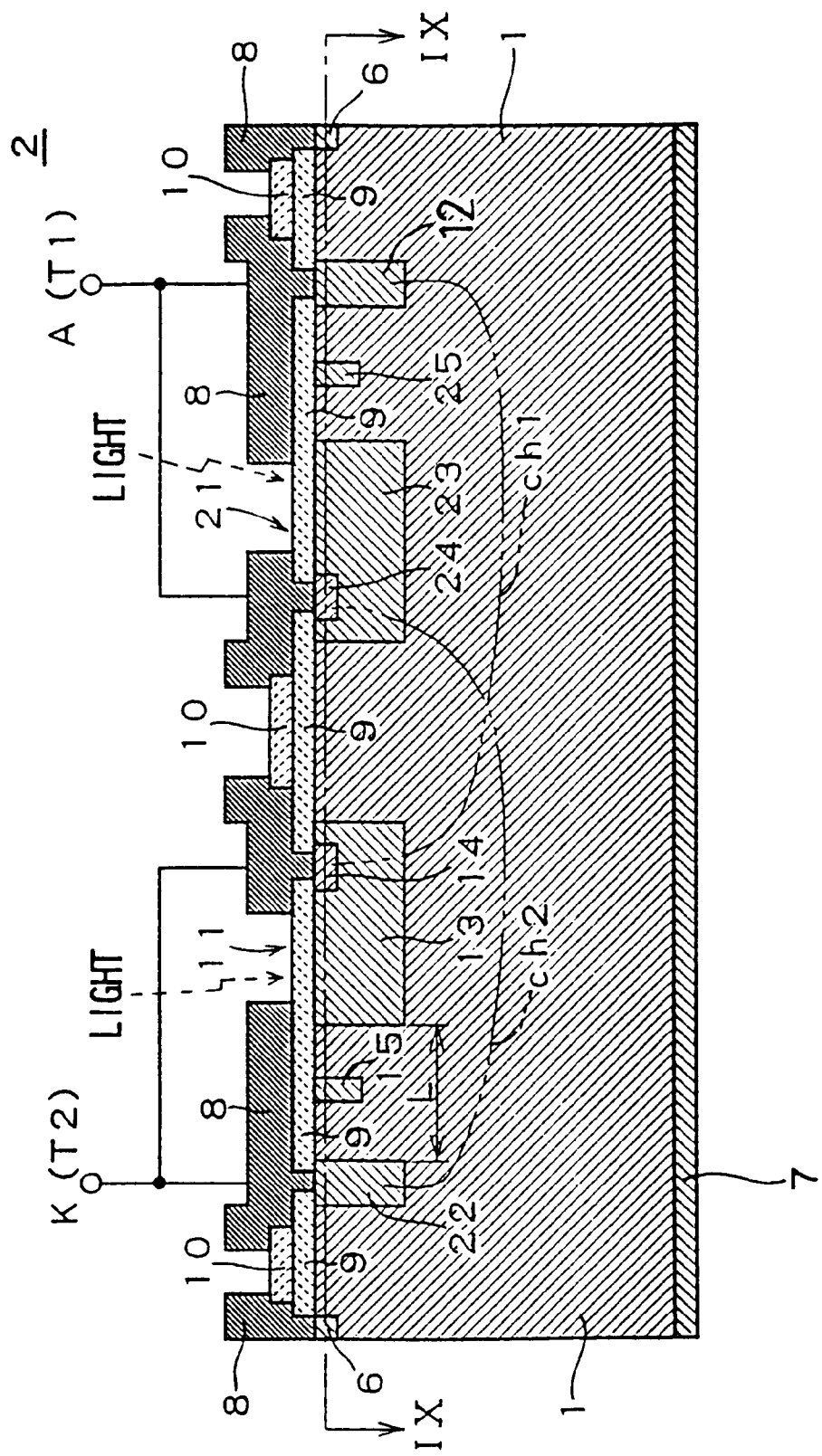
FIG. 10 is a section view taken along the section line X—X of FIG. 9.
Figure 11:
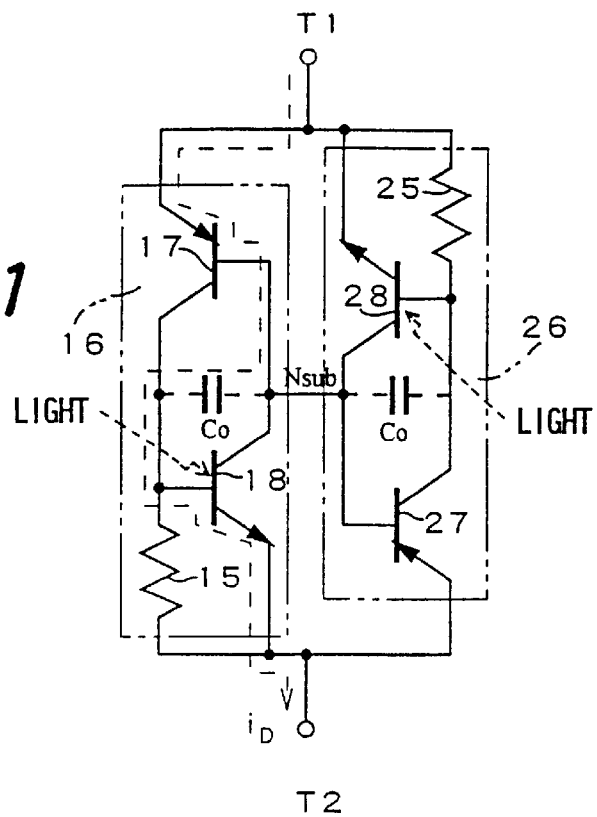
FIG. 11 is a diagram of an equivalent circuit of the bidirectional photothyristor 2 of FIG. 9.
Figure 12:
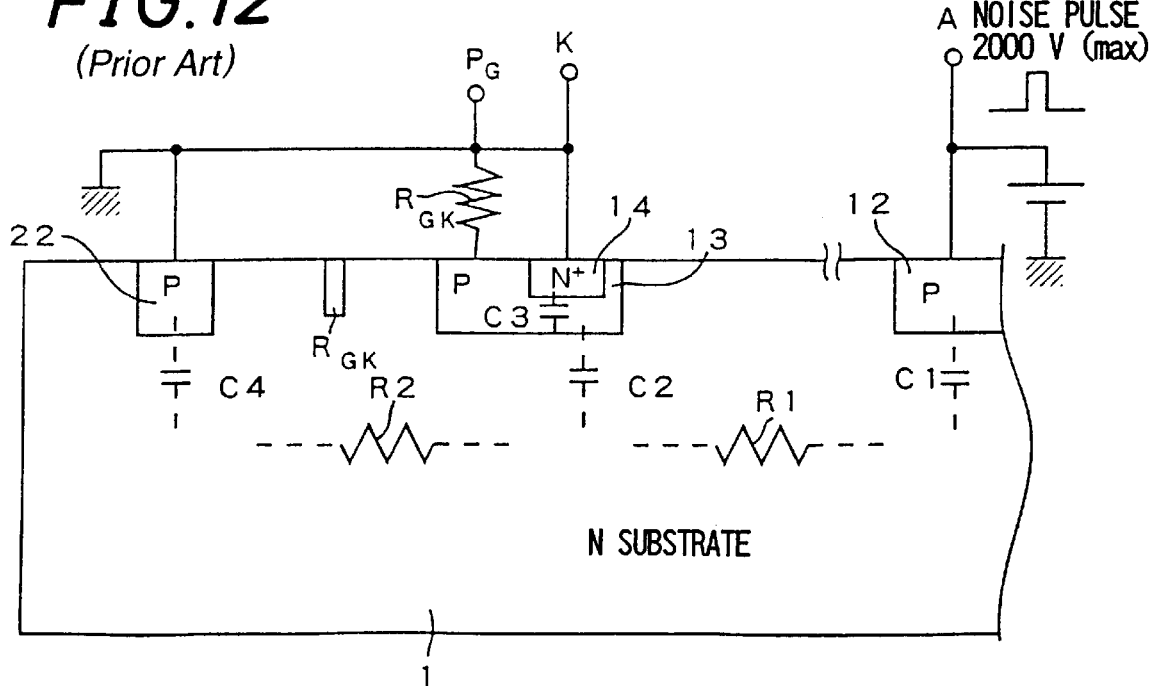
FIG. 12 is a simplified section view showing a state in which parasitic resistors and capacitances considered as a cause a malfunction in a delay voltage mode in the bidirectional photothyristor 2.
Figure 13:
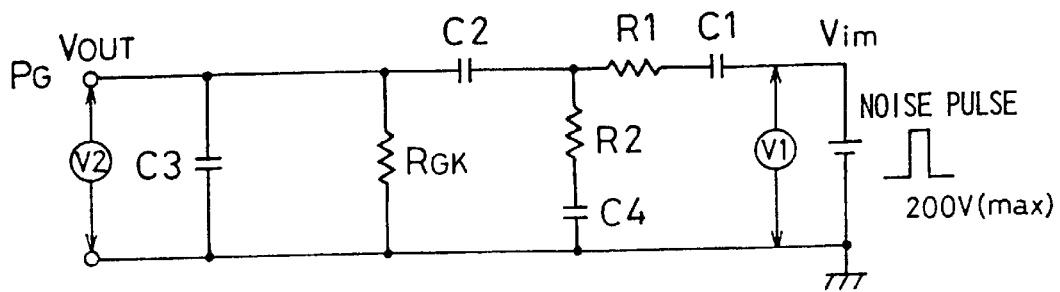
FIG. 13 is a circuit diagram showing a configuration of a differentiation circuit which is composed of the parasitic resistors and capacitances shown in FIG. 12.
Figure 14:
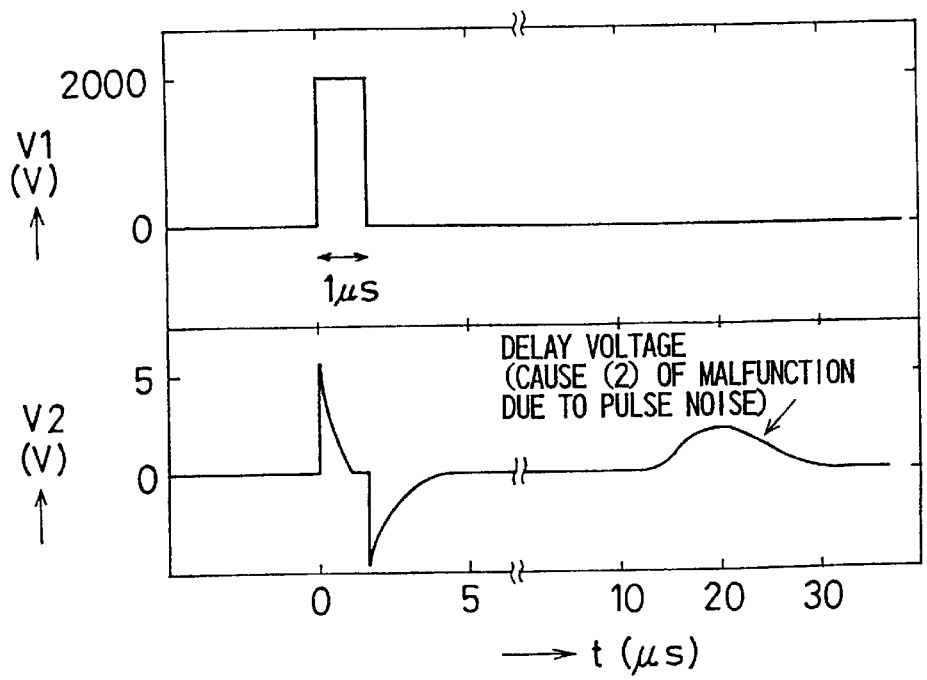
FIG. 14 is a graph showing changes of input and output voltages when a noise pulse is given to the differentiation circuit of FIG. 13.

An N type channel stopper 56 is disposed in the periphery of the N type silicon substrate 29, and an N type diffusion layer 57 is disposed on its back. The anode diffusion region 32 of the one thyristor 36 is electrically joined to the cathode diffusion region 44 of the other thyristor 46, and the cathode diffusion region 34 of the one thyristor 36 is electrically joined to the anode diffusion region 42 of the other thyristor 46 via an Al conductor 58, so as to form an anode electrode (A) and a cathode electrode (K). In FIG. 1, the gate resistance diffusion regions 35 and 45 are formed between the P-gate diffusion regions 33 and 43, and between the anode diffusion regions 42 and 32, respectively. As a result of this electrical coupling, the gate resistance diffusion regions are connected between the gate and the cathode. An $SiO_2$ film 59 and an oxygen-doped semi-insulating film 60 which is formed on the film are used as a passivation film, and, in order to attain a high dielectric strength and high quality, a field plate structure is employed. The Al conductor 58 is opened on the surfaces of the field light receiving portions 39 and 49, and the $SiO_2$ film 59 and an oxygen-doped semi-insulating film 61 are formed so as to constitute a passivation structure. The oxygen-doped semi-insulating film 61 is connected to the cathode electrodes of the thyristors 36 and 46. The concentrations of N type impurities of the N type silicon substrate 29, the cathode diffusion regions 34 and 44, the channel stopper 56, and the N type diffusion layer 57, and those of P type impurities of the anode diffusion regions 32 and 42, and the P-gate diffusion regions 33 and 43 are identical with those of the corresponding portions of the prior art structure shown in FIGS. 9 to 11.

The P-gate light receiving portions 31 and 41 are disposed in the P-gate diffusion regions 33 and 43, respectively. In order to enhance the light sensitivity, therefore, it is preferable to enlarge the P-gate diffusion regions 33 and 43. However, enlargement of the P-gate diffusion regions 33 and 43 increases the junction capacitance Co, and causes the noise resistance to be lowered as the displacement current at the application of dV/dt is increased. In the embodiment, the field light receiving portions 39 and 49 are disposed in circumferences of the P-gate resistance diffusion regions 33 and 43, respectively, whereby the light sensitivity is improved without lowering the noise resistance. In the embodiment, since the oxygen-doped semi-insulating film 60, which is used in a field plate structure of a high dielectric strength, is used, also the passivation of the field light receiving portions 39 and 49 is performed by using the $SiO_2$ film 59 and the oxygen-doped semi-insulating film 61. In place of the oxygen-doped semi-insulating film 61, an electrically conductive polysilicon film may be used. When the openings of the Al conductor 58 have a narrow width of 50 μm or smaller, the oxygen-doped semi-insulating film may be omitted.

Figure 3:
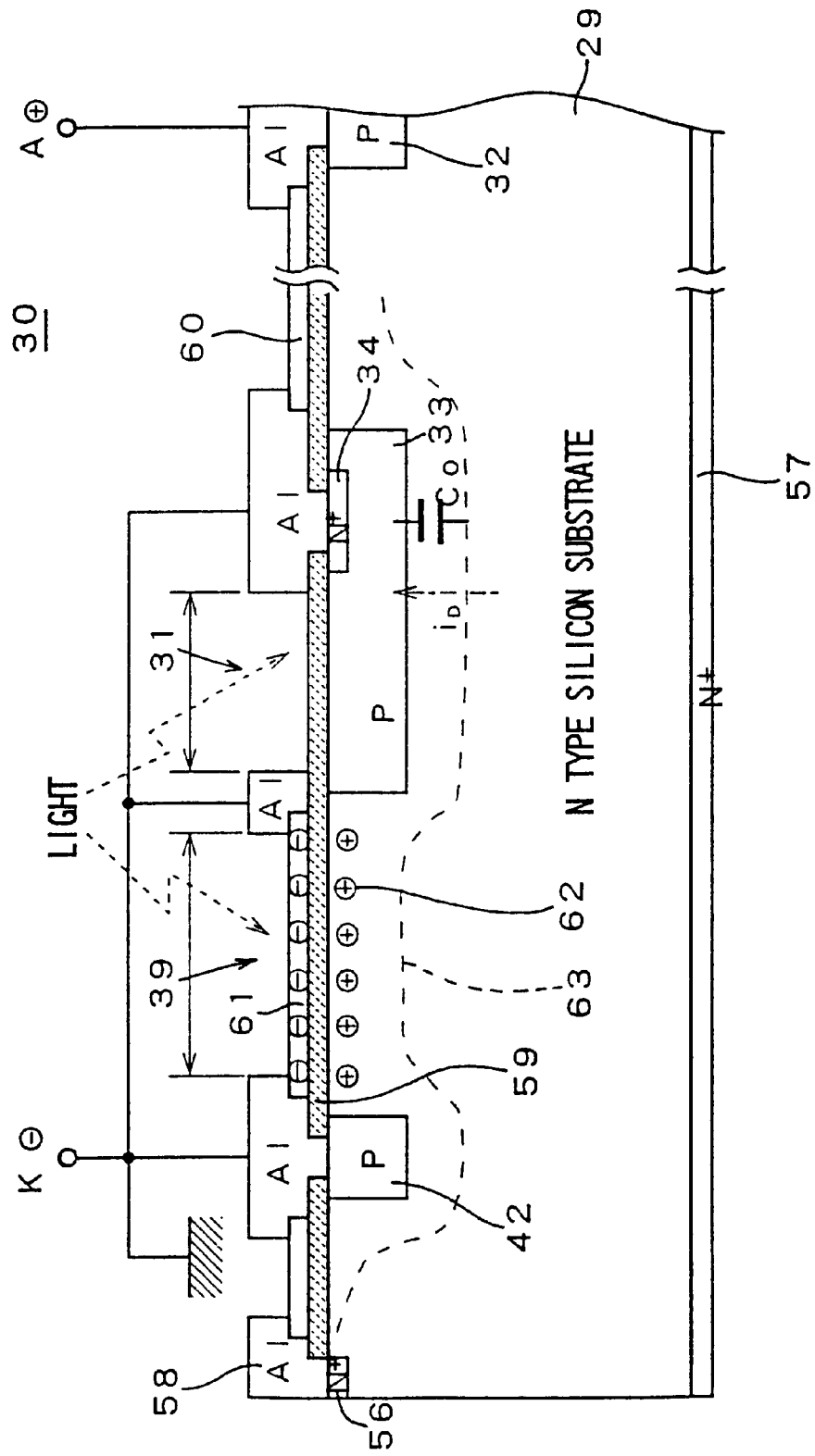
FIG. 3 is a simplified section view showing an operation state of the bidirectional photothyristor 30 of FIG. 1.

FIG. 3 shows functions of the field light receiving portions 39 and 49. When the P-gate diffusion region 33 or 43 of the one thyristor 36 or 46 and the anode diffusion region 42 or 32 of the other thyristor 46 or 36 are reversely biased with respect to the N type silicon substrate 29, P-inversion 62 occurs in the vicinity of the surface of the N type silicon substrate 29 and a depletion layer 63 can easily elongate, thereby preventing the dielectric strength from being lowered. Furthermore, carriers generated when light is received are collected into the depletion layer 63 on the surface so that a photocurrent $I_L$ generated by light irradiation is increased. That is an oxygen-doped semi-insulating film 60, 61 is formed on the field between the P-gate diffusion region 33, 43 of the one thyristor 36, 46 and the anode diffusion region 32, 42 of the other thyristor 36, 46, via a silicon oxide film 59. The oxygen-doped semi-insulating film 60, 61 is electrically conductive. For example, therefore, the film 60, 61 is connected to the cathode side, and the vicinity of the front of the N type silicon substrate 29 is inverted to the P type, whereby the depletion layer 63 is allowed to be easily extended so as to prevent the dielectric strength from being lowered. Furthermore, carriers generated when light is received are collected into the depletion layer 63 so that a photocurrent generated by light irradiation is increased, whereby the light sensitivity can be improved without increasing the junction capacitance.

Figure 4:
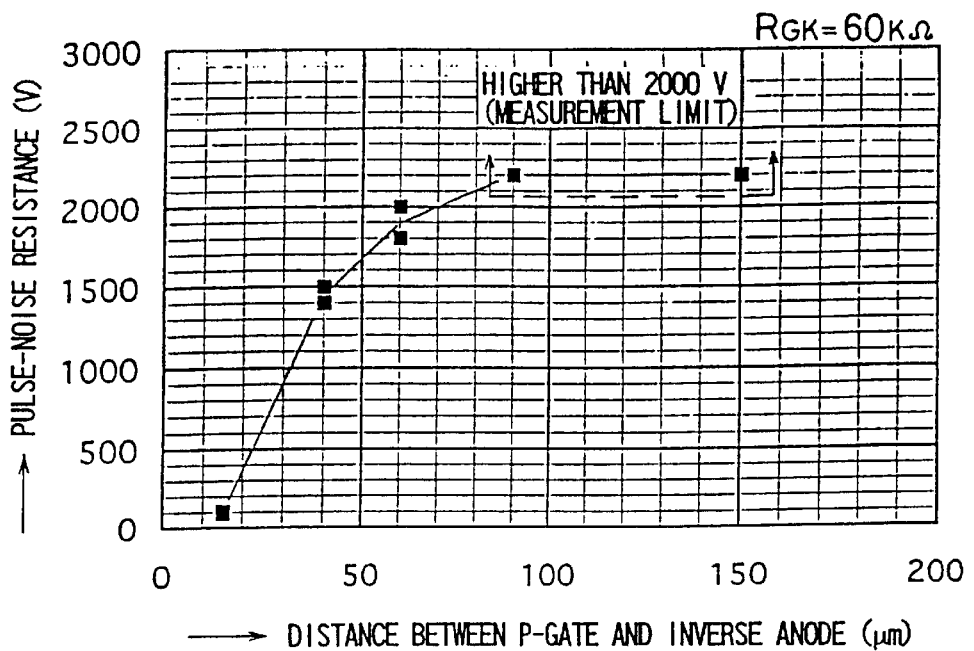
FIG. 4 is a graph showing results of experiments on relationships between the distance between a P-gate diffusion region 13 or 23 of one thyristor 16 or 26 of the bidirectional photothyristor 30 of FIG. 1 and an anode diffusion region 22 or 12 of the other photothyristor 26 or 16, and the pulse-noise resistance.

FIG. 4 shows an example of results of tests on a state where, in the bidirectional photothyristor 30 of the embodiment, the pulse-noise resistance is changed with respect to a change of the distance between the P-gate and the inverse anode corresponding to the distance L between the P-gate diffusion region 33 or 43 of the one thyristor and the anode diffusion region 42 or 32 of the other thyristor. When the distance L is 70 μm or longer, the pulse-noise resistance is 2,000 V or higher and exceeds the measurement limit. When the path in which a current flows becomes longer, an electric resistance which parasitically exists in the N type silicon substrate 29 becomes higher, and hence the noise resistance in the delay mode is improved. When the distance L is 40 μm or longer, the pulse-noise resistance is 1,500 V or higher and sufficient for practical use. When the distance L is excessively long, the chip area for forming the semiconductor integrated circuit is increased and the production cost is raised. When the distance L is 1,000 μm or shorter, the chip area can be within a practical range by adequately setting the arrangement of the diffusion regions, the electrodes, and the like. Particularly, when the distance L is 600 μm or shorter, it is possible to prevent the chip area from being increased. Therefore, it is preferable to set the distance L to be in the range from 40 μm to 1,000 μm. More preferably, the distance L is in the range from 70 μm to 600 μm.

Figure 5:
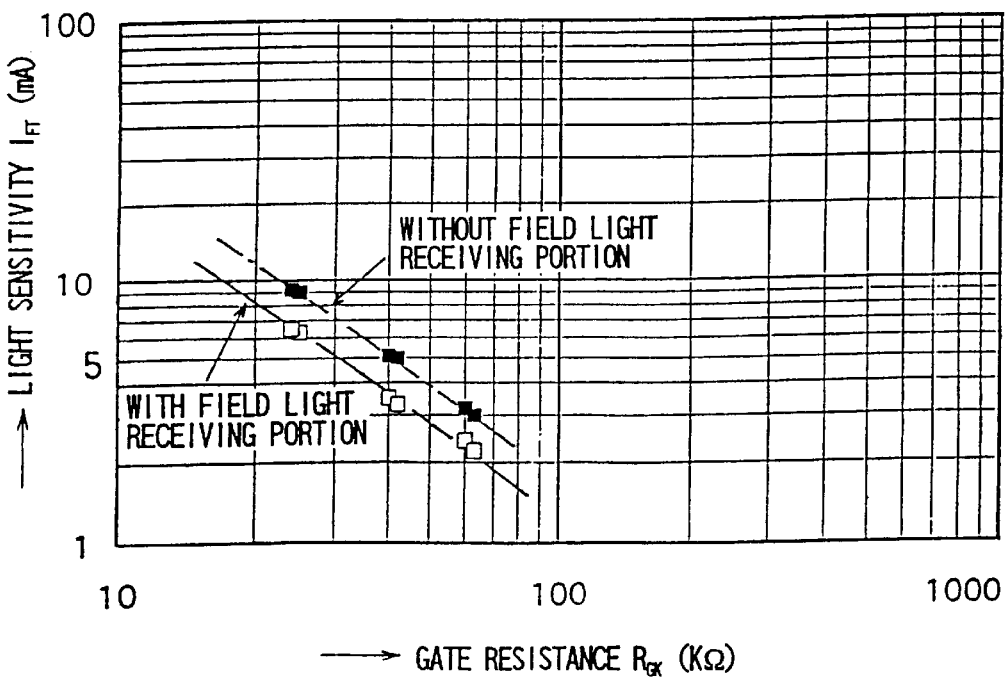
FIG. 5 is a graph showing results of experiments on a relationship between a gate resistance $R_{GK}$ and a light sensitivity $I_{FT}$ by comparing the bidirectional photothyristor 30 having field light receiving portions 39 and 49, with a bidirectional thyristor of the prior art not having field light receiving portions.

FIG. 5 shows an example of results of tests on a state where the light sensitivity $I_{FT}$ changes with respect to a change of the gate resistance $R_{GK}$. When the gate resistance $R_{GK}$ is identical, the light sensitivity $I_{FT}$ is higher by about 30% than that of the prior art structure in which the field light receiving portions 39 and 49 are not formed. When the gate resistance $R_{GK}$ is increased, also the light sensitivity $I_{FT}$ is raised, but the noise resistance in the dV/dt mode is lowered.

Figure 6:
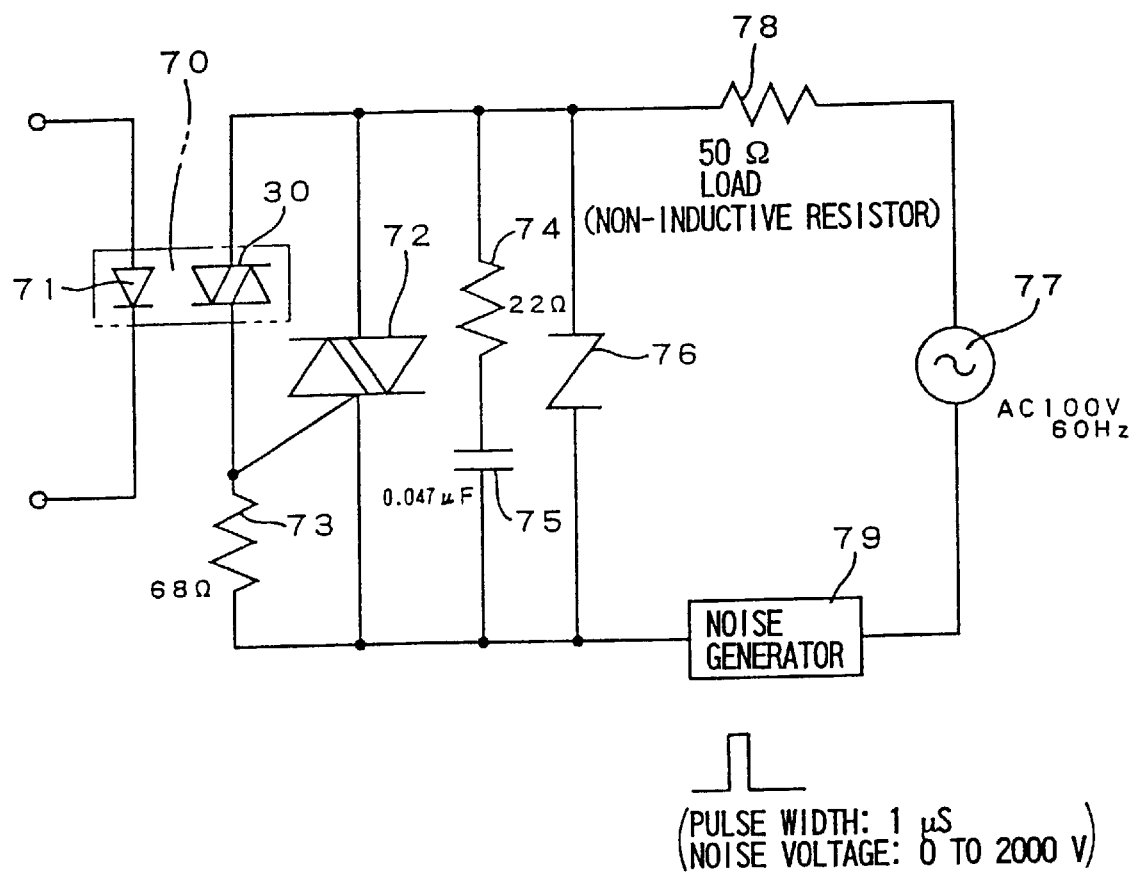
FIG. 6 is an electric circuit diagram showing a state in which the bidirectional photothyristor 30 of FIG. 1 is used as an SSR for ignition.

FIG. 6 shows a configuration for obtaining the test results shown in FIGS. 4 and 5. The bidirectional photothyristor 30 which is to be tested is used in the light receiving portion of an SSR for ignition 70. A light emitting diode (hereinafter, abbreviated as "LED") 71 is disposed in the light emitting portion of the SSR for ignition 70. When the bidirectional photothyristor 30 is brought into conduction, the voltage appearing across the terminals of the gate resistor 73 is applied between the gate and the cathode so as to serve as a trigger signal for the gate of a main bidirectional thyristor 72, thereby enabling a switching control. A series circuit of a resistor 74 and a capacitor 75, and a varistor 76 are used for absorbing a surge. The main bidirectional thyristor 72 phase-controls an angle of flow of the current of AC 100 V line which is supplied from an AC power source 77 to a load 78. A noise generator 79 generates a noise having a pulse width of 1 ƒs whose peak value is changeable in a range of 0 to 2,000 V. The noise is superimposed on the AC line. The noise resistance shown in FIG. 4 is measured as a noise voltage which is generated by the noise generator 79 when the ignition of the main bidirectional thyristor 72 occurs erroneously. The light sensitivity shown in FIG. 5 is measured as a current of the LED 71 for ignition of the main bidirectional thyristor 72.

Figure 7:
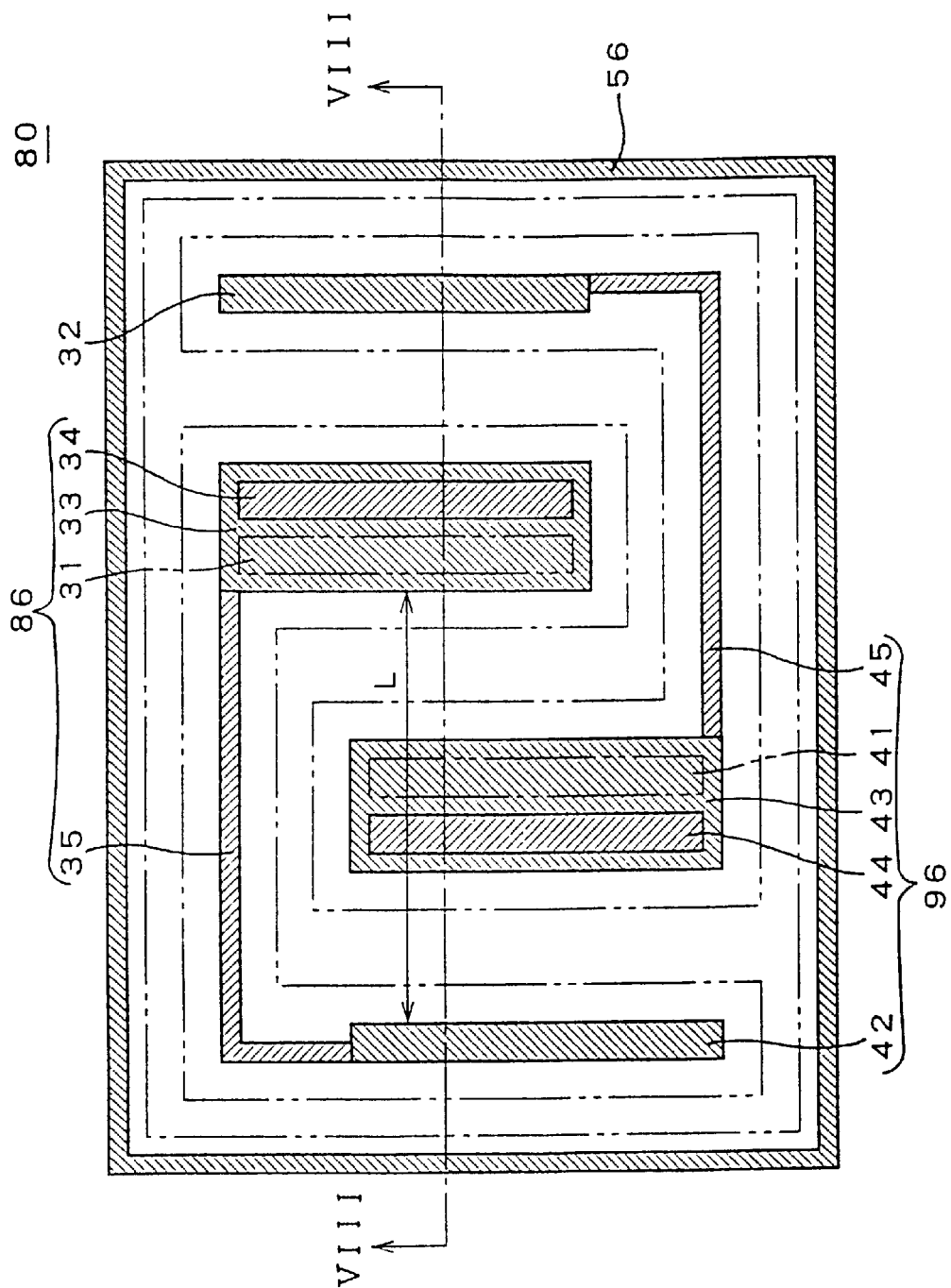
FIG. 7 is a plan section view of a bidirectional photothyristor 80 of another embodiment of the invention.
Figure 8:
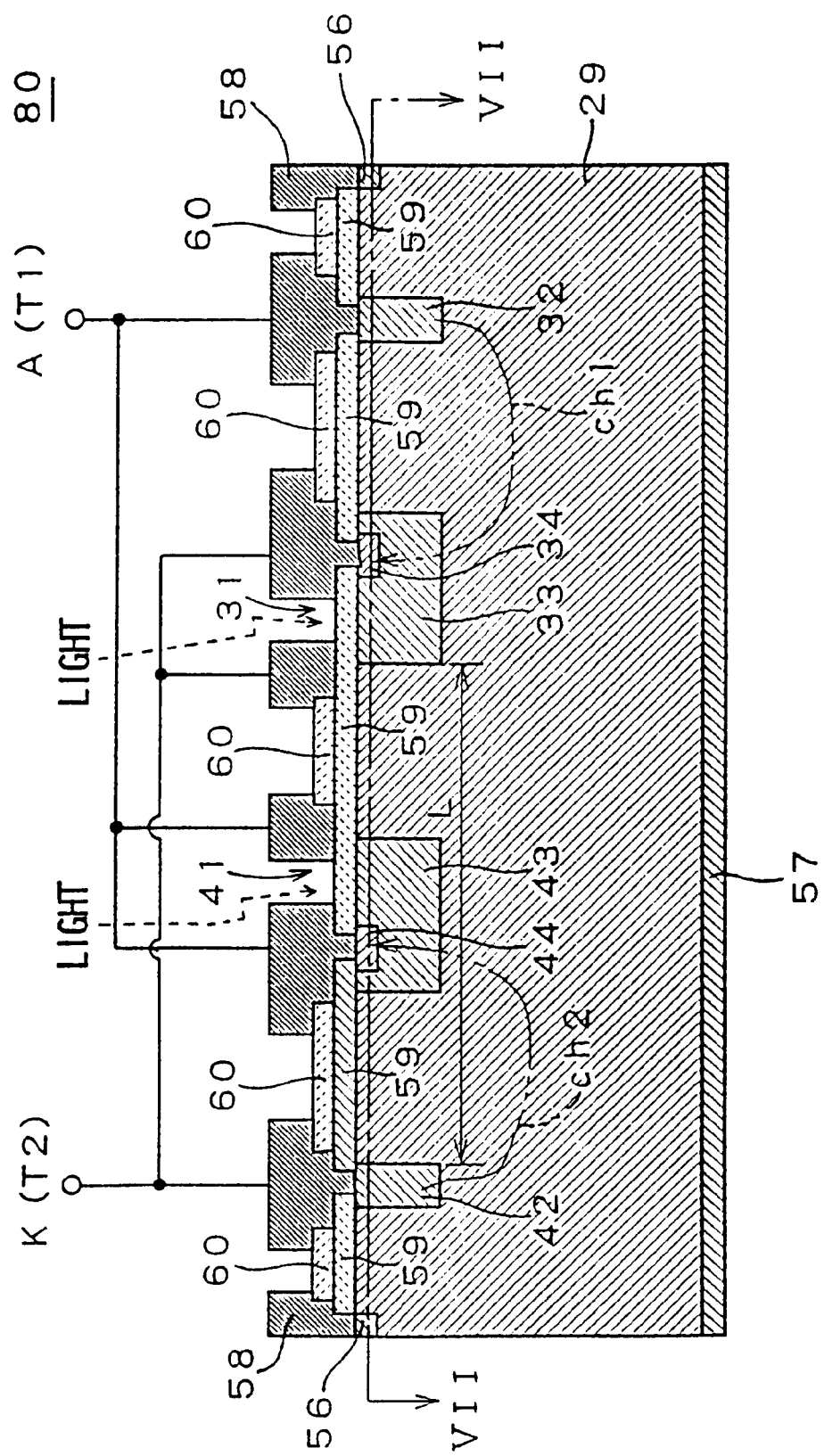
FIG. 8 is a section view taken along a section line VIII—VIII of FIG. 7.

FIGS. 7 and 8 show a basic configuration of a semiconductor integrated circuit chip of a bidirectional photothyristor 80 which is another embodiment of the invention. FIG. 7 is a plan section view, and FIG. 8 is a section view taken along a section line VIII—VIII of FIG. 7. FIG. 7 corresponds to a section view taken along a section line VII—VII of FIG. 8. The components of the embodiment which correspond to those of the embodiment of FIGS. 1 and 2 are designated by the same reference numerals and duplicated description is omitted.

In the embodiment, in a portion of the distance L existing between the P-gate diffusion region 33 or 43 of one thyristor 86 or 96 and the anode diffusion region 42 or 32 of another thyristor 96 or 86, the P-gate diffusion region 43 or 33 of the other thyristor 96 or 86 is disposed. In other words, the anode diffusion regions 32 and 42 and the P-gate diffusion regions 33 and 43 of the thyristors 86 and 96 are adjacently arranged on a surface of the N type silicon substrate 29. In such a hook-like arrangement, the distance L can be increased without increasing an area of a semiconductor chip, and the noise resistance can be enhanced.

This concept that the noise resistance is enhanced by increasing the distance L may be applied not only to a photothyristor but also to a thyristor controlled only by an electrical trigger signal. When a zero-cross circuit is further formed on the same semiconductor chip, the thyristor device can be provided with a zero-cross function. A configuration of a zero-cross circuit is disclosed by the assignee of the present patent application in, for example, FIGS. 1 to 3 attached to Japanese Unexamined Patent Application JP-A 8-225425 (1996). In the disclosed configuration, a switching device is connected between an intermediate layer of a thyristor and a cathode. The switching device is turned off only in a vicinity of a zero-cross point of an applied AC voltage waveform, thereby enabling the thyristor to be triggered. In a period except the vicinity of a zero-cross point, the switching device is brought into conduction so that the thyristor is disabled to be triggered.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A bidirectional thyristor device comprising a pair of planar type thyristors with a PNPN lateral structure, said pair of planar type thyristors being connected in antiparallel and having overlapping channels and said pair of planar type thyristors being formed on a single semiconductor substrate, wherein intervals in a range from 40 $\mu$m to 1,000 $\mu$m are provided between a P-gate diffusion region of one thyristor and an anode diffusion region of the other thyristor and between an anode diffusion region of the one thyristor and a P-gate diffusion region of the other thyristor.

2. The bidirectional thyristor device of claim 1, wherein the intervals are in a range of 70 $\mu$m to 600 $\mu$m.

3. The bidirectional thyristor device of claim 1, wherein a light receiving portion is formed in the P-gate diffusion region of each of the thyristors so that the thyristor device has an optical triggering function.

4. The bidirectional thyristor device of claim 3, wherein light receiving regions for an optical trigger are formed on fields between the P-gate diffusion region of the one thyristor and the anode diffusion region of the other thyristor and between the anode diffusion region of the one thyristor and the P-gate diffusion region of the other thyristor.

5. The bidirectional thyristor device of claim 4, wherein the semiconductor substrate is a silicon substrate, and
   a polysilicon film is formed on a surface of the light receiving regions via a silicon oxide film.

6. The bidirectional thyristor device of claim 4, wherein the semiconductor substrate is a silicon substrate, and
   an oxygen-doped semi-insulating film is formed on a surface of the light receiving regions via a silicon oxide film.

7. The bidirectional thyristor device of claim 1, the thyristor device being provided with a zero-cross function.

8. The bidirectional thyristor device of claim 1, wherein in the pair of thyristors, the channels are formed in a direction parallel to the surface of the semiconductor substrate,
   the P-gate diffusion region, the anode diffusion region, and the cathode diffusion area of each of the thyristors are formed to be perpendicular to a direction of the channels, and
   gate resistance regions are formed between the P-gate diffusion region of the one thyristor and the anode diffusion region of the other thyristor and between the anode diffusion region of the one thyristor and the P-gate diffusion region of the other thyristor, on one end side of a direction perpendicular to the direction of the channels.

9. The bidirectional thyristor device of claim 8, wherein the P-gate diffusion region of one thyristor is formed between the P-gate diffusion region of the other thyristor and the anode diffusion region of the one thyristor and the P-gate diffusion region of the other thyristor is formed between the P-gate diffusion region of the one thyristor and the anode diffusion region of the other thyristor.

10. A bidirectional thyristor device comprising:
    a semiconductor substrate; and
    a lateral arrangement in said semiconductor substrate of anode and gate diffusion regions of a first thyristor and anode and gate diffusion regions of a second thyristor, a cathode diffusion region of said first thyristor being formed in said gate diffusion region of said first thyristor and a cathode diffusion region of said second thyristor being formed in said gate diffusion region of said second thyristor,
    wherein said first and second thyristors are connected in antiparallel and have overlapping channels, and
    wherein a distance L1 between the anode diffusion region of said second thyristor and the gate diffusion region of said first thyristor is in a range from 40 $\mu$m to 1000 $\mu$m and a distance L2 between the anode diffusion region of said first thyristor and the gate diffusion region of said second thyristor is in a range from 40 $\mu$m to 1000 $\mu$m.

11. The bidirectional thyristor device of claim 10, wherein said first thyristor further comprises a field light receiving portion formed between the anode diffusion region of said first thyristor and the gate diffusion region of said second thyristor; and
    said second thyristor further comprises a field light receiving portion formed between the anode diffusion region of said second thyristor and the gate diffusion region of said first thyristor.

12. The bidirectional thyristor device of claim 11, further comprising:
    a first film of silicon dioxide and a second film of one or the other of an oxygen-doped semi-insulating film and a polysilicon film formed on the field light receiving portions of said first and second thyristors.

13. The bidirectional thyristor device of claim 12, wherein the second film formed on the field light receiving portion of said first thyristor is connected to the cathode diffusion region of said first thyristor and the second film formed on the field light receiving portion of said second thyristor is connected to the cathode diffusion region of said second thyristor.

14. The bidirectional thyristor device of claim 10, wherein the anode diffusion region of said second thyristor and the cathode diffusion region of said first thyristor are electrically connected to the same first electrode; and the anode diffusion region of said first thyristor and the cathode diffusion region of said second thyristor are electrically connected to the same second electrode.

15. The bidirectional thyristor of claim 10, further comprising:

a first gate resistance region connecting the anode diffusion region of said second thyristor to the gate diffusion region of said first thyristor; and a second gate resistance region connecting the anode diffusion region of said first thyristor to the gate diffusion region of said second thyristor.

16. The bidirectional thyristor device of claim 10, further comprising:

a first gate light receiving portion formed in the gate diffusion region of said first thyristor; and a second gate light receiving portion formed in the gate diffusion region of said second thyristor.

17. The bidirectional thyristor device of claim 10, wherein L1 and L2 are each in a range from 70 $\mu$m to 600 $\mu$m.

18. The bidirectional thyristor device of claim 10, wherein the anode diffusion region of said second thyristor, the gate diffusion region of said first thyristor, the gate diffusion region of said second thyristor and the anode diffusion region of the first thyristor are laterally arranged in this order in said semiconductor substrate.

19. The bidirectional thyristor device of claim 10, wherein the anode diffusion region of said second thyristor, the gate diffusion region of said second thyristor, the gate diffusion region of said first thyristor and the anode diffusion region of said first thyristor are laterally arranged in this order in said semiconductor substrate.

20. The bidirectional thyristor device of claim 10, further comprising:

a channel stopper region arranged in said semiconductor substrate around said first and second thyristors.

* * * * *